(12) United States Patent
Leong

(10) Patent No.: US 12,356,730 B2
(45) Date of Patent: Jul. 8, 2025

(54) PASSIVE SUBSTRATE VOLTAGE DISCHARGE CIRCUIT FOR BIDIRECTIONAL SWITCHES

(71) Applicant: Infineon Technologies Austria AG, Villach (AT)

(72) Inventor: Kennith Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 696 days.

(21) Appl. No.: 17/684,902

(22) Filed: Mar. 2, 2022

(65) Prior Publication Data

US 2023/0282638 A1 Sep. 7, 2023

(51) Int. Cl.
*H03K 17/56* (2006.01)
*H10D 89/60* (2025.01)

(52) U.S. Cl.
CPC ........... *H10D 89/911* (2025.01); *H03K 17/56* (2013.01); *H10D 89/611* (2025.01); *H10D 89/814* (2025.01)

(58) Field of Classification Search
None
See application file for complete search history.

(56) References Cited

U.S. PATENT DOCUMENTS

| | | | |
|---|---|---|---|
| 7,164,589 | B1 | 1/2007 | Soldano et al. |
| 7,595,680 | B2 | 9/2009 | Morita et al. |
| 7,768,758 | B2 | 8/2010 | Maier et al. |
| 7,825,467 | B2 | 11/2010 | Willmeroth et al. |

(Continued)

FOREIGN PATENT DOCUMENTS

| | | |
|---|---|---|
| CN | 102640288 A | 8/2012 |
| CN | 105871365 A | 8/2016 |

(Continued)

OTHER PUBLICATIONS

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf; 2018, pp. 1-45.

(Continued)

*Primary Examiner* — Thomas J. Hiltunen
(74) *Attorney, Agent, or Firm* — Murphy, Bilak & Homiller, PLLC

(57) ABSTRACT

A semiconductor device includes a semiconductor body having an active region and a substrate region that is disposed beneath the active region, and a bidirectional switch formed in the semiconductor body. The bidirectional switch includes first and second gate structures that are each configured to control a conductive state of an electrically conductive channel that is disposed in the active region, and first and second input-output terminals that are each in ohmic contact with the electrically conductive channel. A passive substrate voltage discharge circuit in parallel with the bidirectional switch is configured to discharge a voltage of the substrate region in both directions of the bidirectional switch. The passive substrate voltage discharge circuit includes first and second normally-on switches connected in anti-series between the first and second input-output terminals in a common source configuration with the substrate region as a midpoint.

22 Claims, 8 Drawing Sheets

(56) References Cited

U.S. PATENT DOCUMENTS

| | | | |
|---|---|---|---|
| 7,852,137 B2 | 12/2010 | Machida et al. | |
| 7,868,353 B2* | 1/2011 | Machida | H01L 27/0727 |
| | | | 257/192 |
| 7,875,907 B2 | 1/2011 | Honea et al. | |
| 8,344,424 B2 | 1/2013 | Suh et al. | |
| 8,487,667 B2 | 7/2013 | Iwamura | |
| 8,604,512 B2* | 12/2013 | Morita | H01L 29/7786 |
| | | | 257/133 |
| 8,649,198 B2 | 2/2014 | Kuzumaki et al. | |
| 8,664,690 B1 | 3/2014 | Chen et al. | |
| 9,276,569 B2 | 3/2016 | Ikeda | |
| 9,443,845 B1 | 9/2016 | Stafanov et al. | |
| 10,224,924 B1* | 3/2019 | Leong | H01L 29/7787 |
| 10,296,033 B2* | 5/2019 | Adachi | G05F 3/205 |
| 10,411,698 B2 | 9/2019 | Sato et al. | |
| 10,784,853 B2* | 9/2020 | Leong | H01L 29/7787 |
| 10,811,525 B2* | 10/2020 | Kinoshita | H01L 29/1066 |
| 10,979,032 B1 | 4/2021 | Leong et al. | |
| 11,088,688 B2 | 8/2021 | Pala | |
| 12,051,979 B2* | 7/2024 | Kanomata | H01L 29/42316 |
| 12,081,207 B2* | 9/2024 | Leong | H03K 17/102 |
| 2006/0145744 A1 | 7/2006 | Diorio et al. | |
| 2009/0167411 A1 | 7/2009 | Machida et al. | |
| 2009/0206363 A1 | 8/2009 | Machida et al. | |
| 2010/0155775 A1 | 6/2010 | Gauthier et al. | |
| 2012/0217542 A1 | 8/2012 | Morita | |
| 2012/0262220 A1 | 10/2012 | Springett | |
| 2012/0287688 A1 | 11/2012 | Fornage et al. | |
| 2014/0145208 A1 | 5/2014 | Rose et al. | |
| 2014/0197448 A1 | 7/2014 | Galy et al. | |
| 2014/0203289 A1 | 7/2014 | Liu et al. | |
| 2014/0264431 A1 | 9/2014 | Lal | |
| 2014/0374766 A1* | 12/2014 | Bahl | H01L 27/0629 |
| | | | 438/237 |
| 2015/0043116 A1 | 2/2015 | Weyers et al. | |
| 2015/0180469 A1 | 6/2015 | Kim | |
| 2015/0256163 A1 | 9/2015 | Weis | |
| 2016/0079233 A1 | 3/2016 | Deboy et al. | |
| 2016/0247799 A1 | 8/2016 | Stafanov et al. | |
| 2016/0322485 A1 | 11/2016 | Padmanabhan et al. | |
| 2016/0344381 A1 | 11/2016 | Cai | |
| 2017/0047841 A1 | 2/2017 | Zojer et al. | |
| 2017/0062419 A1 | 3/2017 | Rose et al. | |
| 2017/0084600 A1 | 3/2017 | Isobe | |
| 2017/0103978 A1 | 4/2017 | Prechtl et al. | |
| 2017/0338809 A1 | 11/2017 | Stefanov et al. | |
| 2017/0357283 A1 | 12/2017 | Adachi | |
| 2018/0219008 A1 | 8/2018 | Prechtl et al. | |
| 2019/0006499 A1* | 1/2019 | Kinoshita | H01L 29/778 |
| 2019/0068181 A1 | 2/2019 | Leong | |
| 2019/0199289 A1 | 6/2019 | Wei et al. | |
| 2019/0252921 A1 | 8/2019 | Lethellier et al. | |
| 2019/0326280 A1 | 10/2019 | Imam et al. | |
| 2020/0098745 A1 | 3/2020 | Roig-Guitart | |
| 2020/0287536 A1 | 9/2020 | Udrea et al. | |
| 2021/0210481 A1 | 7/2021 | Guan et al. | |
| 2022/0084916 A1 | 3/2022 | Sugiyama et al. | |
| 2022/0157981 A1 | 5/2022 | Gupta et al. | |
| 2022/0385196 A1* | 12/2022 | Kanomata | H03K 17/687 |
| 2022/0416784 A1* | 12/2022 | Harrison | H03K 17/6871 |
| 2024/0072161 A1* | 2/2024 | Sharma | H01L 29/7786 |

FOREIGN PATENT DOCUMENTS

| | | | |
|---|---|---|---|
| EP | 3249815 A1 | 11/2017 | |
| TW | 200541073 A | 12/2005 | |
| WO | 2005002054 A1 | 1/2005 | |
| WO | 2017159559 A1 | 9/2017 | |
| WO | 2021206065 A1 | 10/2021 | |
| WO | 2023278194 A1 | 1/2023 | |

OTHER PUBLICATIONS

Li, Xueqing, et al., "Medium Voltage Power Module Based on SiC JFETs", IEEE Applied Power Electronics Conference and Exposition (APEC), Mar. 26, 2017, pp. 3033-3037.

Haehre, K., et al., "Switching Speed-Control of an Optimized Capacitor-Clamped Normally-On Silicon Carbide JFET Cascode", 15th International Power Electronics and Motion Control Conference, EPE-PEMC 2012 ECCE Europe, Novi Sad, Serbia, Sep. 4, 2012, pp. DSla.11-1-DSla.11-5.

Oladele, Olanrewaju Kabir, et al., "Optimizing Switching Performance of Cascade-Light SiC JFET Bidirectional Switch for Matrix Converter", IEEE International Power Electronics and Application Conference and Exposition (PEAC), 2018, pp. 1-6.

Huber, et al., U.S. Appl. No. 17/542,660, filed Dec. 6, 2021, pp. 1-24.

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, pp. 1218-1226.

Chowdhury, Dilder, "GaN FETs: Why cascode?", Sep. 30, 2020, pp. 1-6.

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, pp. 1868-1878.

Kolar, J.W., et al., "Novel Three-Phase AC-DC-AC Sparse Matrix Converter", IEEE, 2002, pp. 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, pp. 1-9.

Soeiro, Thiago B., et al., "Three-Phase Modular Multilevel Current Source Rectifiers for Electric Vehicle Battery Charging Systems", IEEE, 2013, pp. 623-629.

* cited by examiner

PASSIVE SUBSTRATE VOLTAGE DISCHARGE CIRCUIT FOR BIDIRECTIONAL SWITCHES

BACKGROUND

Two separate gates with a common drain in a monolithic device is a popular configuration for realizing a bidirectional switch. The monolithic device is typically implemented in a common substrate, where each of the two gates has its own gate driver. The common drain configuration has a source at either end of the monolithic device, meaning that a source connection to the substrate is not an option for the bidirectional switch. If the substrate is kept floating and one of the two sources is biased at a high voltage, that source in conjunction with the adjacent gate acts as an extended drain and thus follows the high potential. The substrate must be kept as close to ground potential during on-state as possible for stable bidirectional device operation. Conventionally, two back-to-back diodes are integrated with their anodes connected to the substrate and each cathode connected to either end of the sources. However, such a back-to-back diode implementation does not hold the substrate voltage to the desired voltage (close to 0V) during the on-state of the bidirectional switch and thus degrades device performance. Instead, the substrate experiences a large negative potential because negative charge stored in the substrate during the on-state of the bidirectional switch is confined to the substrate which is in the middle point of the back-to-back diode. This confinement is induced by either diode in the back-to-back diodes initially forward-biased during the off-state of the bidirectional switch but changed to the blocking mode when the bidirectional device switches from the off-state to the on-state Hence, there is a need for a more effective monolithic solution for providing a discharge path for the substrate during the off-to-on switching of a bidirectional switch.

SUMMARY

According to an embodiment of a semiconductor device, the semiconductor device comprises: a semiconductor body comprising an active region and a substrate region that is disposed beneath the active region; a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; and a passive substrate voltage discharge circuit in parallel with the bidirectional switch and configured to discharge a voltage of the substrate region in both directions of the bidirectional switch, the passive substrate voltage discharge circuit comprising first and second normally-on switches connected in anti-series between the first and second input-output terminals in a common source configuration with the substrate region as a midpoint.

According to another embodiment of a semiconductor device, the semiconductor device comprises: a semiconductor body comprising an active region and a substrate region that is disposed beneath the active region; a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; a first normally-on switch having a drain terminal electrically connected to the first input-output terminal of the bidirectional switch, a source terminal electrically connected to the substrate region by a first passive voltage clamping device or circuit, and a gate terminal electrically connected to the substrate region; and a second normally-on switch having a drain terminal electrically connected to the second input-output terminal of the bidirectional switch, a source terminal electrically connected to the substrate region by a second passive voltage clamping device or circuit, and a gate terminal electrically connected to the substrate region.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a passive substrate voltage discharge circuit monolithically integrated with a main bidirectional switch for discharging the substrate voltage to a desired voltage (e.g., close to 0V) during the on-state of the bidirectional switch. The substrate voltage discharge circuit is passive in that no additional gate drivers, auxiliary supplies or control components are required to ensure proper operation, thus providing a fundamentally passive solution for holding the semiconductor substrate of the bidirectional switch at a desired voltage during the on-state of the bidirectional switch.

While the discharge circuit described herein may be monolithically integrated with the main bidirectional switch, the discharge circuit instead may be external to (i.e., not integrated with) the main bidirectional switch. In this case, the electrical connections described herein between the discharge circuit and the main bidirectional switch may be formed through respective terminals of separate dies and/or packages which include the discharge circuit and the main bidirectional switch. Die-to-die, die-to-package, and package-to-package terminal connections are well known in the semiconductor device arts and can be implemented, e.g., by wire bonds, metal clips, metal ribbons, solder bumps, die stacking, package stacking, etc., and hence no further explanation is given herein to such terminal connections.

Described next with reference to the figures are embodiments of the passive substrate voltage discharge circuit.

Figure 1:
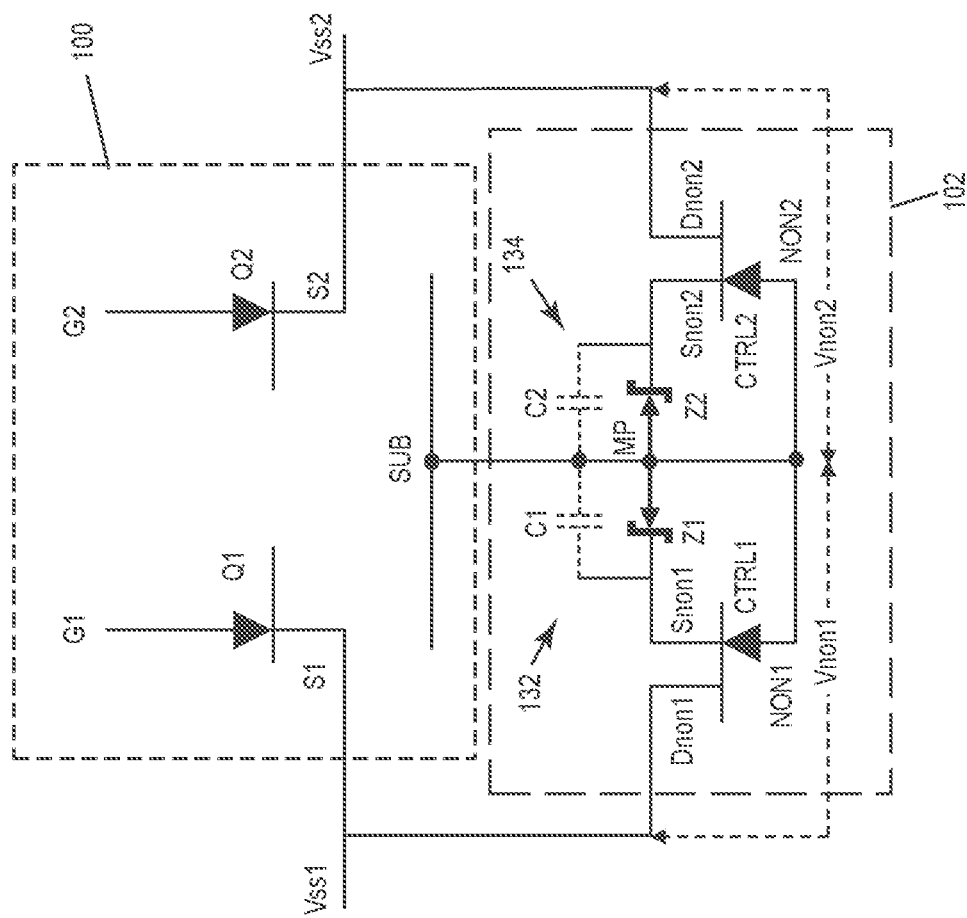
FIG. 1 illustrates a circuit schematic of an embodiment of a semiconductor device that includes a main bidirectional switch and a discharge circuit for providing a substrate discharge path during off-to-on switching of the bidirectional switch.

FIG. 1 illustrates a circuit schematic of an embodiment of a semiconductor device that includes a main bidirectional switch 100 and a discharge circuit 102 for providing a substrate discharge path during off-to-on switching of the bidirectional switch 100. The main bidirectional switch 100 is formed on a semiconductor substrate which is schematically represented by the node labeled 'SUB' in FIG. 1. The main bidirectional switch 100 has first and second gates G1, G2, first and second sources S1, S2, and a common or virtual drain to which there is no physical connection. The first source S1 of the main bidirectional switch 100 is electrically connected to a first input-output terminal Vss1. The second source S2 of the main bidirectional switch 100 is electrically connected to a second input-output terminal Vss2.

The main bidirectional switch 100 has four primary operational states: OFF/OFF in which both gates G1, G2 of the main bidirectional switch 100 are off; ON/ON in which both gates G1, G2 of the main bidirectional switch 100 are on; ON/OFF in which the first gate G1 of the main bidirectional switch 100 is on and the second gate G2 of the main bidirectional switch 100 is off; and OFF/ON in which the first gate G1 of the main bidirectional switch 100 is off and the second gate G2 of the main bidirectional switch 100 is on. The typical operation of a bidirectional switch includes transitioning from OFF/OFF to ON/ON, ON/OFF to ON/ON, and from OFF/ON to ON/ON. The current flow direction depends on the polarity across the first and second input-output terminals Vss1, Vss2. The current flow direction can be reversed by changing the polarity.

Figure 2:
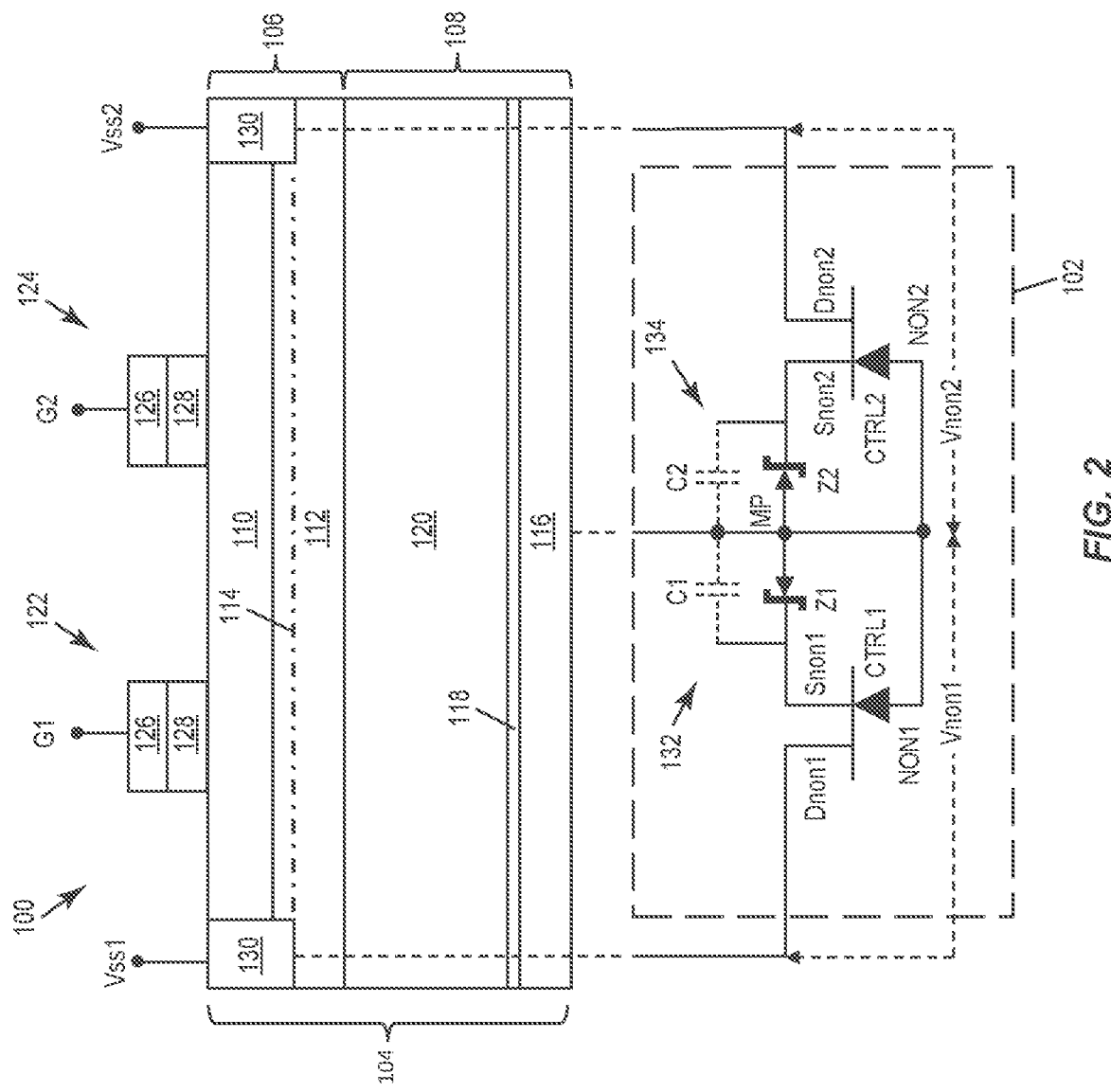
FIG. 2 illustrates a cross-sectional view of an embodiment of the physical implementation of the bidirectional switch in a semiconductor body.

The main bidirectional switch 100 is schematically represented by main transistors Q1 and Q2 in FIG. 1. Main transistors Q1 and Q2 share a common drain and have sources S1, S2 at opposite ends of the main bidirectional switch 100 in the case of a lateral device. FIG. 2 illustrates a cross-sectional view of an embodiment of the physical implementation of the bidirectional switch 100 in a semiconductor body 104. The bidirectional switch 100 may be implemented as a bidirectional HEMT (high-electron mobility transistor) in FIG. 2.

The semiconductor body 104 has an upper active region 106 and a lower region 108 that is disposed beneath the active region 106. The active region 106 refers to the layers or regions of the semiconductor body 104 that provide an electrically conductive channel. For example, in the depicted embodiment, the active region 106 includes first and second type III-V semiconductor layers 110, 112. The second type III-V semiconductor layer 112 is formed from a semiconductor material having a different band gap than the first type III-V semiconductor layer 110. For example, the first type III-V semiconductor layer 110 may include intrinsic or lightly doped gallium nitride (GaN) and the second type III-V semiconductor layer 112 may include aluminum gallium nitride (AlGaN). More generally, any combination of type III-V semiconductor materials with different metallic contents can be used to provide a difference in bandgap. Due to the difference in bandgap between the first and second type III-V semiconductor layers 110, 112, an electrically conductive two-dimensional charge carrier gas channel 114 arises near an interface between the first type III-V semiconductor layer 110 and the second type III-V semiconductor layer 112 due to polarization effects. Alternatively, instead of type III-V semiconductor material, the active region 106 may include group IV semiconductor materials such as Silicon (Si), Silicon carbide (SiC), Silicon germanium (SiGe), etc. The semiconductor materials may be doped to form active device regions, e.g., source, drain, collector, emitter, etc., which provide a controllable electrically conductive channel in a known manner.

The lower portion 108 of the semiconductor body 104 includes various regions of the semiconductor body 104 that do not directly contribute in an electrical sense to the provision of the electrically conductive channel 114. In the depicted embodiment, the lower portion 108 of the semiconductor body 104 includes a substrate region 116, a nucleation layer 118, and a lattice transition region 120. The substrate region 116 may include or be formed from group IV or group III-V semiconductor materials. For example, according to one embodiment, the substrate region 116 may be provided by a silicon or silicon-based wafer. The nucleation layer 118, which may include a metal nitride (e.g., AlN), and the lattice transition region 120, which may include a number of semiconductor nitride (e.g., AlGaN) layers with a gradually diminishing metallic content, are provided on the substrate region 116 to enable the formation of relatively strain and defect free group IV semiconductor material thereon. More generally, the substrate region 116 may include any intrinsic or bulk portion of the substrate that is beneath the active region 106, and is more conductive than an intermediary region that is between the substrate region 116 and the active region 106.

The bidirectional switch 100 operates as follows. At a first voltage polarity, in which the second input-output terminal Vss2 is at a higher potential than the first input-output terminal Vss1, voltage blocking is primarily handled by a first gate structure 122. That is, an "OFF" signal applied to the first gate structure 122 (e.g., 0V, relative to the first input-output terminal Vss1) disrupts the channel 114 and causes the device to be in a blocking mode. The bidirectional switch 100 becomes conductive by applying an "ON" signal (e.g., a positive voltage, relative to the first input-output terminal Vss1) to the first gate structure 122, which places the channel 114 in a conductive state. At a second voltage polarity, in which the first input-output terminal Vss1 is at a higher potential than the second input-output terminal Vss2, the opposite condition applies. That is, voltage blocking is primarily handled by a second gate structure 124. In this way, the bidirectional switch 100 can block or permit a current to flow in either direction between the first and second input-output terminals Vss1, Vss2. The bidirectional switch 100 may have symmetrical voltage blocking capability at either voltage polarity. Alternatively, the bidirectional switch 100 may be configured to have a greater voltage blocking capability at one of the two voltage polarities. This may be achieved by, among other things, adjusting the distance between the first and second gate structures 122, 124 and the first and second input-output terminals Vss1, Vss2.

The first and second gate structures 122, 124 may each include an electrically conductive gate electrode 126. According to one embodiment, the first and second gate structures 122, 124 may each also include an intermediary region 128 configured (e.g., by doping) to provide an integrated diode in the respective gate structures 122, 124. In the case of a type III-V semiconductor device, the first and second gate structures 122, 124 may be configured to alter the intrinsically conductive state of the two-dimensional charge carrier gas channel 114 in the active region 106 of the semiconductor body 104.

One problem associated with a bidirectional switch 100 that is integrated into a single substrate 104, as is the case in the device of FIG. 2, is the so-called "common substrate" problem. In the absence of any further measures, there is a parasitic capacitive coupling that occurs between the first and second input-output terminals Vss1, Vss2 and the substrate region 116. If the substrate region 116 is not adequately discharged, the voltages across these parasitic capacitances can vary during the operation of the device, which may degrade the channel 114 and affect the switching behavior during operation of the bidirectional switch 100. In a conventional unidirectional device, this problem is typically solved by tying the substrate of the device to the same potential as the reference potential terminal (e.g., the source terminal) and thus shunting one side of the parasitic substrate capacitance. However, this solution is not available in a bidirectional device because there is no dedicated reference potential terminal. That is, the first input-output terminal Vss1 acts as a reference potential at one voltage polarity whereas the second input-output terminal Vss2 acts as a reference potential at the opposite voltage polarity.

The passive substrate voltage discharge circuit 102, which is electrically connected in parallel with the main bidirectional switch 100, e.g., at respective source contact regions 130 of the bidirectional switch 100, discharges the voltage of the substrate region 116 in both directions of the bidirectional switch 100. The discharge circuit 102 includes first and second normally-on switches NON1, NON2 connected in anti-series between the first and second input-output terminals Vss1, Vss2 in a common source configuration with the substrate region 116 as a midpoint 'MP'. The control terminals CTRL1, CTRL2 of the respective normally-on switches NON1, NON2 are electrically connected to the substrate region 116/midpoint MP and thus do not require active control.

The switches NON1, NON2 of the passive substrate voltage discharge circuit 102 are 'normally-on' switches in that a current conduction channel is present between the source and drain terminals Snonx, Dnonx of the respective switch NON1, NON2 absent any voltage being applied to the corresponding control terminal CTRLx. For example, the normally-on switches NON1, NON2 of the passive substrate voltage discharge circuit 102 may be normally-on HEMTs. The normally-on switches NON1, NON2 of the passive substrate voltage discharge circuit 102 may be integrally formed in the semiconductor body 104 shown in FIG. 2.

The passive substrate voltage discharge circuit 102 includes a first passive voltage clamping device or circuit 132 that electrically connects the source terminal Snon1 of the first normally-on switch NON1 to the substrate region 116/midpoint MP. A second passive voltage clamping device or circuit 134 of the passive substrate voltage discharge circuit 102 electrically connects the source terminal Snon2 of the second normally-on switch NON2 to the substrate region 116/midpoint MP. According to the embodiment illustrated in FIGS. 1 and 2, the first voltage clamp circuit 132 includes a first Zener diode Z1 having a cathode electrically connected to the source terminal Snon1 of the first normally-on switch NON1 and an anode electrically connected to the substrate region 116/midpoint MP. The second voltage clamp circuit 134 includes a second Zener diode Z2 having a cathode electrically connected to the source terminal Snon2 of the second normally-on switch NON2 and an anode electrically connected to the substrate region 116/midpoint MP. The first voltage clamp circuit 132 may also include a first capacitor C1 electrically connected in parallel with the first Zener diode Z1 and the second voltage clamp circuit 134 may also include a second capacitor C2 electrically connected in parallel with the second Zener diode Z2.

In the off-state (ON/OFF or OFF/ON for Q1 and Q2) of the main bidirectional switch 100 or when transitioning from the OFF/OFF state to the ON/ON state, the main bidirectional switch 100 is in a blocking state. Under these conditions, a relatively high voltage (e.g., 200V) may be applied across the first and second input-output terminals Vss1, Vss2 with the second input-output terminal Vss2 being at the higher potential, for example. In this case, the first passive voltage clamping device or circuit 132 maintains the first normally-on switch NON1 in an on state such that the voltage Vnon1 across the first normally-on switch NON1 is clamped to a positive forward threshold voltage (e.g., less than 2V, e.g., about 1V) above the voltage at the first input-output terminal Vss1. The second passive voltage clamping device or circuit 134 builds up the voltage between the substrate region 116 and the source terminal Snon2 of the second normally-on switch NON2 such that the second normally-on switch NON2 turns off and the voltage Vnon2 across the second normally-on switch NON2 corresponds to the voltage across the first and second input-output terminals Vss1, Vss2 less the voltage across the first normally-on switch NON1. For example, if Vss2–Vss1 is 370V and Vnon1 is 1 V, then Vsub2 is 369V.

If the first input-output terminal Vss1 is instead at the higher potential in the off-state of the main bidirectional switch 100, the second passive voltage clamping device or circuit 134 would maintain the second normally-on switch NON2 in an on state such that the voltage Vnon2 across the second normally-on switch NON2 is clamped to a positive forward threshold voltage (e.g., less than 2V, e.g., about 1V) above the voltage at the second input-output terminal Vss2. The first passive voltage clamping device or circuit 132 would build up the voltage between the substrate region 116 and the source terminal Snon1 of the first normally-on switch NON1 such that the first normally-on switch NON1 turns off and the voltage Vnon1 across the first normally-on switch NON1 corresponds to the voltage across the first and second input-output terminals Vss1, Vss2 less the voltage across the second normally-on switch NON2.

When the main bidirectional switch 100 transitions from the off-state (ON/OFF, OFF/ON or OFF/OFF for Q1 and Q2) to the on-state (ON/ON for Q1 and Q2), a current channel forms in the main bidirectional switch 100 and practically no voltage drop occurs across the switch 100. That is, the voltage across the first and second input-output terminals Vss1, Vss2 drops to a conduction voltage in the on-state of the main bidirectional switch 100. The voltage (Vnon1+Vnon2) across the first and second normally-on switches NON1, NON2 of the passive substrate voltage discharge circuit 102 follows the voltage across the first and second input-output terminals Vss1, Vss2 until the normally-on switch NON2 that was turned off in the off-state of the main bidirectional switch 100 turns back on again. Whether the first normally-on switch NON1 or the second normally-on switch NON2 turned off in the off-state of the main bidirectional switch 100 depends on whether the first input-output terminal Vss1 or the second input-output terminal Vss2 was at the higher potential, as described above.

In the on state of the bidirectional switch 100, the passive voltage clamping circuits 132, 134 bring the gate-to-source voltage of the corresponding first and second normally-on switches NON1, NON2 to below their respective gate threshold voltages. For example, if the second input-output terminal Vss2 was at the higher potential in the off-state of the main bidirectional switch 100, the first passive voltage clamping device or circuit 132 clamps the voltage Vnon1 across the first normally-on switch NON1 to a negative voltage when the bidirectional switch 100 is in the on state. The second passive voltage clamping device or circuit 134 enables the voltage Vnon2 across the second normally-on switch NON2 to discharge into Vnon1 when the bidirectional switch 100 transitions to the on state. If the first input-output terminal Vss1 instead was at the higher potential in the off-state of the main bidirectional switch 100, the second passive voltage clamping device or circuit 134 would clamp the voltage Vnon2 across the second normally-on switch NON2 to a negative voltage when the bidirectional switch 100 is in the on state and the first passive voltage clamping device or circuit 132 would enable the voltage Vnon1 across the first normally-on switch NON1 to discharge into Vnon2 when the bidirectional switch 100 transitions to the on state.

In either case, both normally-on switches NON1, NON2 of the passive substrate voltage discharge circuit 102 conduct when the bidirectional switch 100 is in the on state. This allows the charged stored in the parasitic substrate capacitances to redistribute through the channel of the bidirectional switch 100 across a voltage divider formed by the passive substrate voltage discharge circuit 102. Since the source-to-midpoint voltage of both normally-on switches NON1, NON2 of the passive substrate voltage discharge circuit 102 are prevented from exceeding the threshold of the voltage clamp formed by the discharge circuit 102, these two voltages are clamped to a low enough voltage that does not affect the operation of the main bidirectional switch 100, e.g., less than −10V. The exact clamping voltage depends on the device parameters and may be designed to a desired value. In one embodiment, the clamping voltage of the first voltage clamp circuit 132 is higher in absolute magnitude than the turn-off threshold voltage of the first normally-on switch NON1 and the clamping voltage of the second voltage clamp circuit 134 is higher in absolute magnitude than the turn-off threshold voltage of the second normally-on switch NON2.

Figure 3:
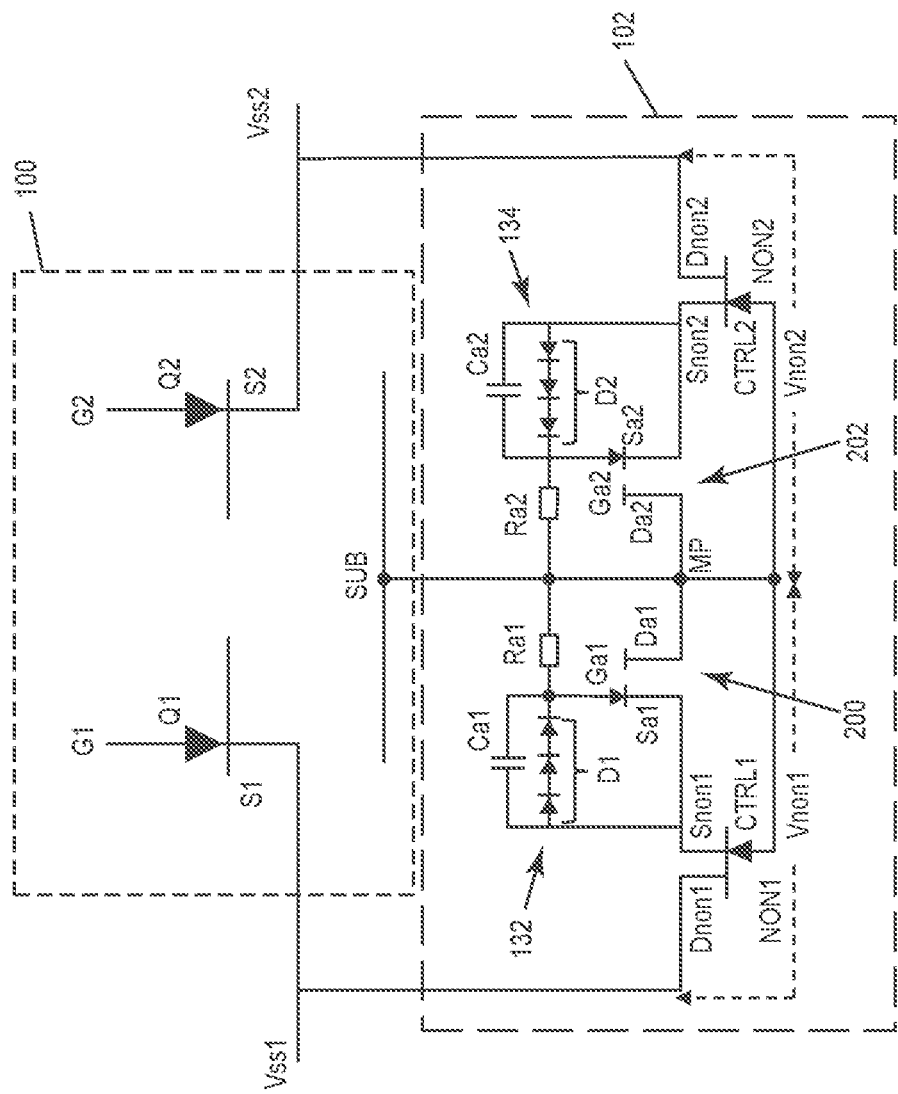
FIG. 3 illustrates a circuit schematic of another embodiment of a semiconductor device that includes a main bidirectional switch and a discharge circuit for providing a substrate discharge path during off-to-on switching of the bidirectional switch.

FIG. 3 illustrates a circuit schematic of another embodiment of a semiconductor device that includes the main bidirectional switch 100 and the passive substrate voltage discharge circuit 102. According to this embodiment, the first voltage clamp circuit 132 of the passive substrate voltage discharge circuit 102 includes a first normally-off switch 200 having a source terminal Sa1 electrically connected to the source terminal Snon1 of the first normally-on switch NON1, a drain terminal Da1 electrically connected to the substrate region 116/midpoint MP, and a gate Ga1 electrically connected to the substrate region 116/midpoint MP by a first resistor Ra1. The second voltage clamp circuit 134 of the passive substrate voltage discharge circuit 102 includes a second normally-off switch 202 having a source terminal Sa2 electrically connected to the source terminal Snon2 of the second normally-on switch NON2, a drain terminal Da2 electrically connected to the substrate region 116/midpoint MP, and a gate Ga2 electrically connected to the substrate region 116/midpoint MP by a second resistor Ra2. The resistors Ra1, Ra2 of the voltage clamp circuits 132, 134 may be realized by respective two-dimensional charge carrier gas channels such as a 2DEG (two-dimensional electron gas).

The normally-off switches 200, 202 of the passive substrate voltage discharge circuit 102 are 'normally-off' switches in that a current conduction channel is disrupted between the source and drain terminals Sax, Dax of the respective switch 200, 202 absent any voltage being applied to the corresponding gate terminal Gax. For example, the normally-off switches 200, 202 of the passive substrate voltage discharge circuit 102 may be normally-off HEMTs. In one embodiment, the first and second normally-off switches 200, 202 of the passive substrate voltage discharge circuit 102 each have a voltage rating that is at least an order of magnitude lower than a voltage rating of the main bidirectional switch 100. For example, the transistors Q1 and Q2 of the bidirectional switch 100 and the normally-on switches NON1, NON2 of the passive substrate voltage discharge circuit 102 may have a voltage rating of 650V whereas the first and second normally-off switches 200, 202 of the passive substrate voltage discharge circuit 102 may have a voltage rating of 20V. This, however, is just an example and should not be considered limiting in any way.

The first voltage clamp circuit 132 of the passive substrate voltage discharge circuit 102 may also include at least one series connected diode D1 electrically connected between the source terminal Snon1 of the first normally-on switch NON1 and the gate Ga1 of the first normally-off switch 200. The second voltage clamp circuit 134 may also include at least one series connected diode D2 electrically connected between the source terminal Snon2 of the second normally-on switch NON2 and the gate Ga2 of the second normally-off switch 202. The series connected diodes D1, D2 of the voltage clamp circuits 132, 134 may be pn diodes, for example.

The first voltage clamp circuit 132 may further include a capacitor Ca1 electrically connected in parallel with the at least one series connected diode D1 of the first voltage clamp circuit 132. The second voltage clamp circuit 134 may also include a capacitor Ca2 electrically connected in parallel with the at least one series connected diode D2 of the second voltage clamp circuit 134.

The resistors Ra1, Ra2 and series connected diodes D1, D2 of the voltage clamp circuits 132, 134 emulate the Zener diodes Z1, Z2 shown in FIGS. 1 and 2 and may be designed to clamp at any voltage required. For example, a first quasi-Zener clamp is formed by the first normally-off switch 200 with the drain terminal Da1 electrically connected to the substrate region 116/midpoint MP which is electrically connected to the gate Ga1 of the first normally-off switch 200 via the first resistor Ra1 which may be in the range of tens of kiloohms, for example. The at least one series connected diode D1 yields a voltage that is high enough to turn off the first normally-on switch NON1. A second quasi-Zener clamp is formed by the second normally-off switch 202 with the drain terminal Da2 electrically connected to the substrate region 116/midpoint MP which is electrically connected to the gate Ga2 of the second normally-off switch 202 via the second resistor Ra2 which also may be in the range of tens of kiloohms. The at least one series connected diode D1 of the first voltage clamp circuit 132 yields a voltage that is high enough to turn off the first normally-on switch NON1, and the at least one series connected diode D2 of the second voltage clamp circuit 134 yields a voltage that is high enough to turn off the second normally-on switch NON2.

Regardless of whether the main bidirectional switch 100 is hard or soft switched, the substrate to source voltage that is referenced to the low potential side is clamped at near zero volts when the bidirectional switch 100 is in the on state. With hard switching, voltage and current are applied to the bidirectional switch 100 during on-off transitions. With soft switching, the bidirectional switch 100 is turned on and off at zero current or voltage.

Figure 4:
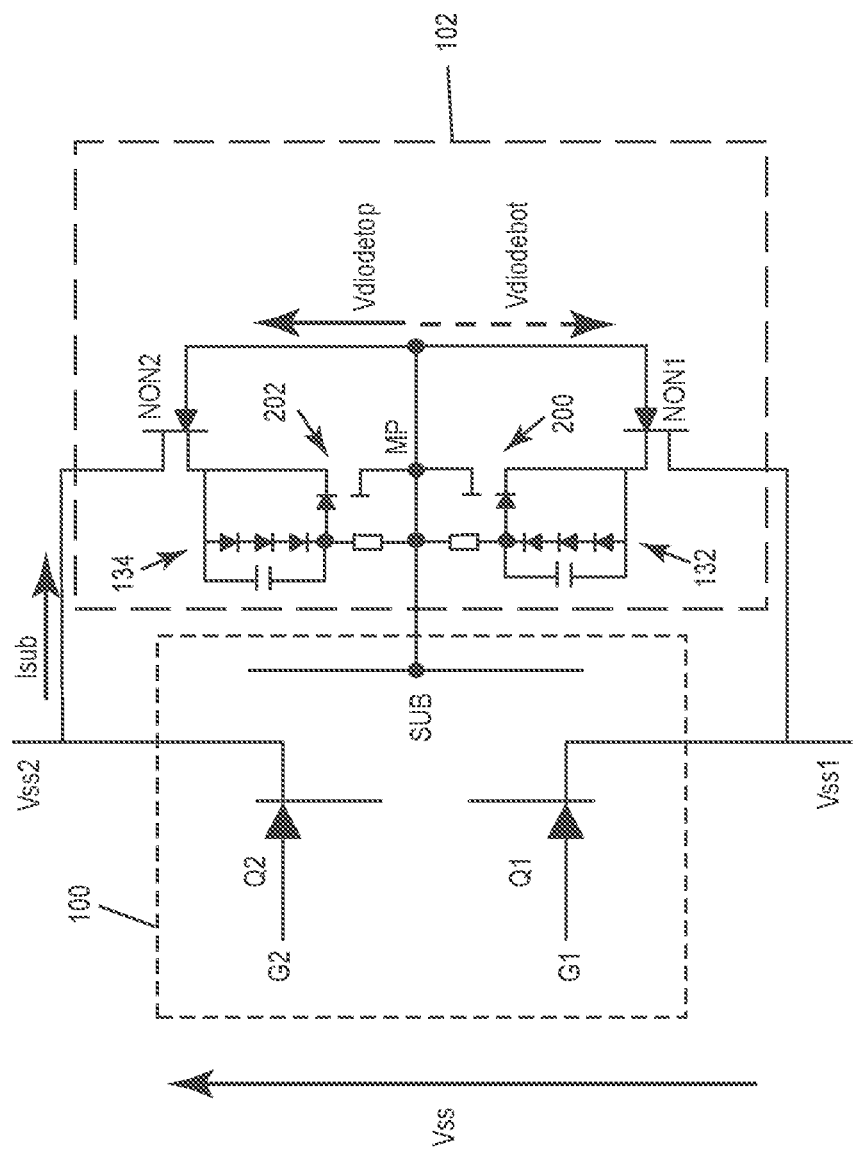
FIGS. 4 through 8 illustrate the semiconductor device in FIG. 3 under different operating conditions, including the bidirectional switch in an on-to-off switching transition (FIG. 4), the bidirectional switch in an off-to-on switching transition (FIG. 6), and various current and voltage waveforms associated with the on-to-off switching transition (FIG. 5) and the off-to-on switching transition (FIGS. 7 and 8).

FIGS. 4 through 8 illustrate the semiconductor device in FIG. 3 under different operating conditions. In FIG. 4, the main bidirectional switch 100 is turned off and a relatively high voltage Vss (e.g., 400V in this example) is applied across the main bidirectional switch 100 with the second input-output terminal Vss2 being at a higher potential than the first input-output terminal Vss1. Under these conditions, the first passive voltage clamping device or circuit 132 maintains the first normally-on switch NON1 in an on state such that the voltage across the first normally-on switch NON1 is clamped to a positive forward threshold voltage (e.g., less than 2V, e.g., about 1V) above the voltage at the first input-output terminal Vss1. The second passive voltage clamping device or circuit 134 builds up the voltage Vdiodetop between the substrate region 116/midpoint MP and the source terminal Snon2 of the second normally-on switch NON2 such that the second normally-on switch NON2 eventually turns off.

Figure 5:
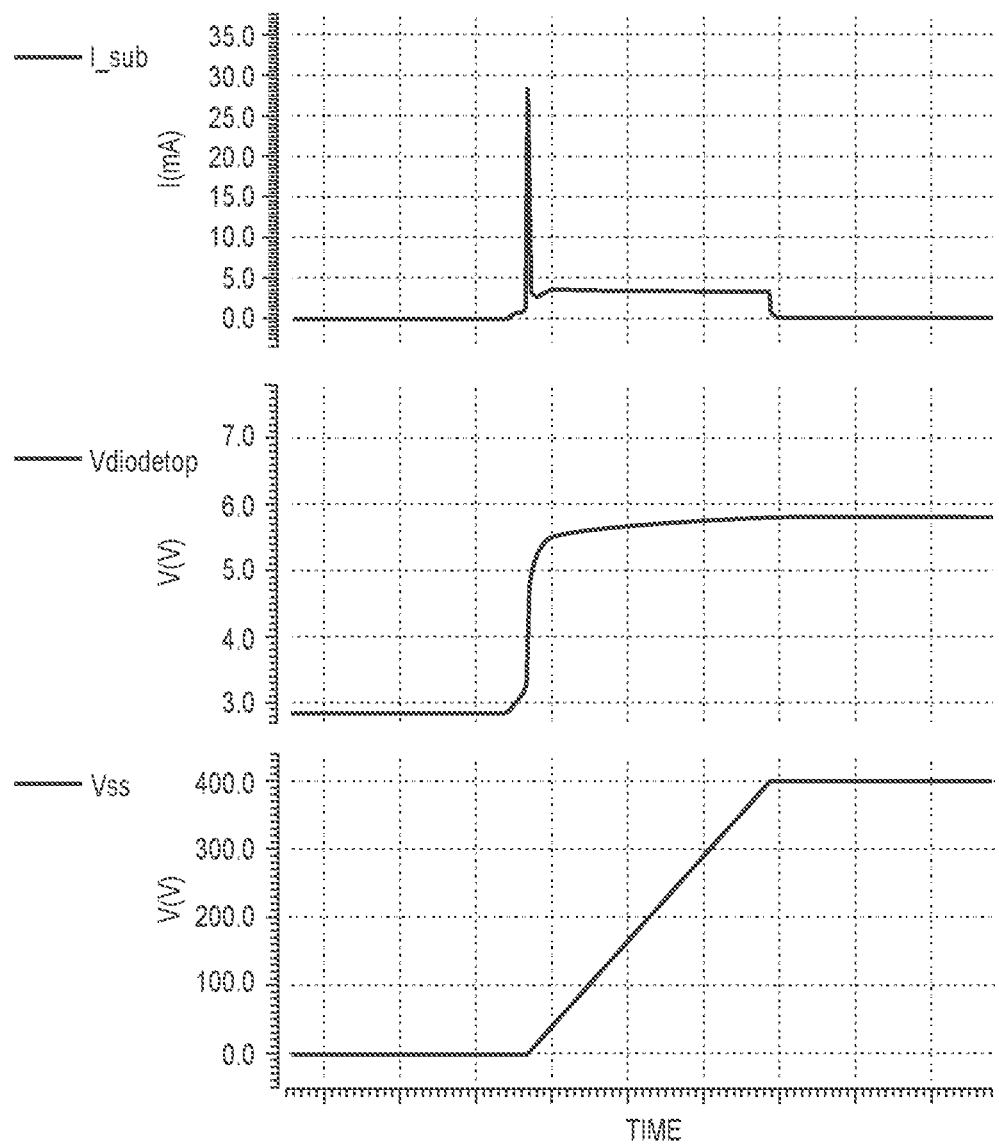

FIG. 5 shows the off-state voltage Vss applied across the main bidirectional switch 100, the voltage Vdiodetop between the substrate region 116/midpoint MP and the source terminal Snon2 of the second normally-on switch NON2, and the corresponding substrate current Isub for the example where Vss=400V.

As explained above, if the first input-output terminal Vss1 was at the higher potential, the second passive voltage clamping device or circuit 134 would maintain the second normally-on switch NON2 in an on state and the first passive voltage clamping device or circuit 132 would build up the voltage Vdiodebot between the substrate region 116/midpoint MP and the source terminal Snon1 of the first normally-on switch NON1 such that the first normally-on switch NON1 would eventually turn off.

Figure 6:
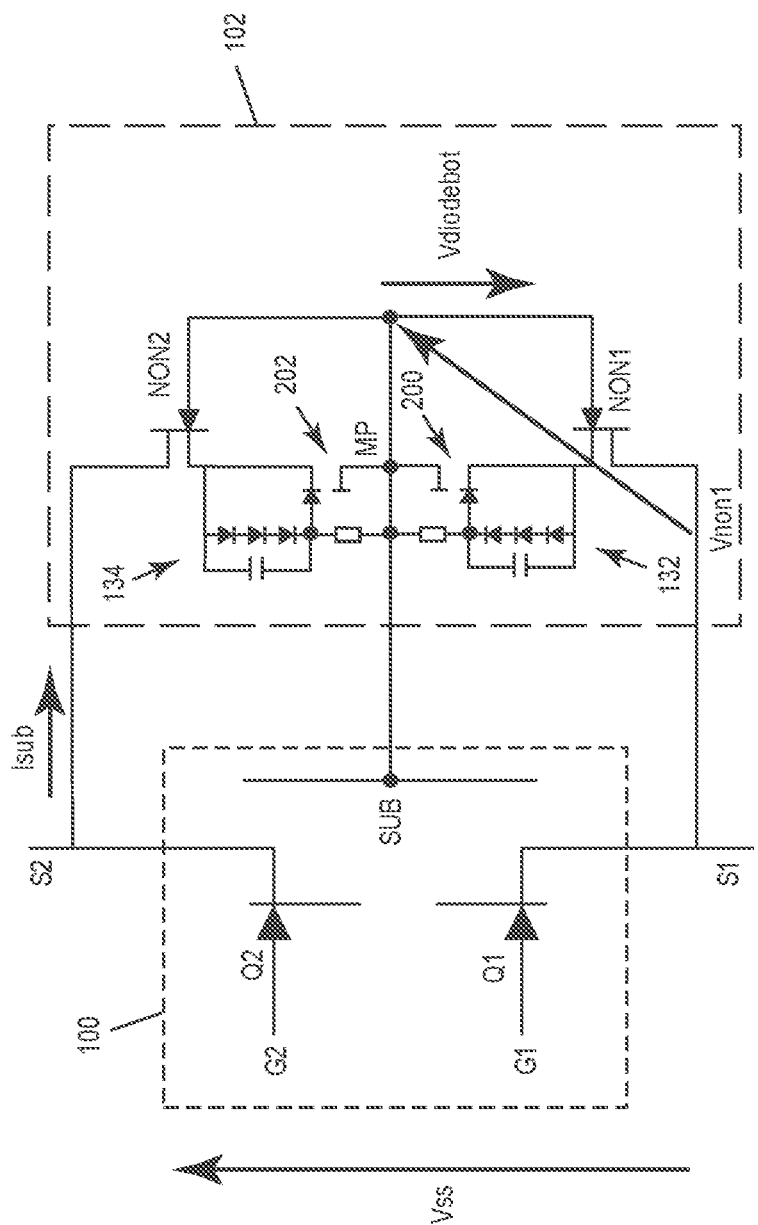

FIG. 6 illustrates a transition from the off-state (ON/OFF, OFF/ON or OFF/OFF for Q1 and Q2) to the on-state (ON/ON for Q1 and Q2) of the main bidirectional switch 100 with the second input-output terminal Vss2 being at a higher potential than the first input-output terminal Vss1. Under these conditions, the first passive voltage clamping device or circuit 132 clamps the voltage Vnon1 across the first normally-on switch NON1 to a negative voltage when the bidirectional switch 100 is in the on state. The second passive voltage clamping device or circuit 134 enables the voltage Vnon2 across the second normally-on switch NON2 to discharge into Vnon1 since the channel is ON/conducting (Vnon1 rises to approximately half of −Vss in FIG. 7 at the beginning part of the off-state to on-state transition). That is, when the bidirectional switch 100 transitions from the off state to an on state, the voltage Vss across the first and second input-output terminals Vss1, Vss2 drops to a conduction voltage and the second passive voltage clamping device or circuit 134 of the passive substrate voltage discharge circuit 102 provides a discharge path for the voltage Vnon2 across the second normally-on switch NON2 until the second normally-on switch NON2 turns back on. When the second normally-on switch NON2 turns back on, the voltage Vdiodebot between the substrate region 116/midpoint MP and the source terminal Snon1 of the first normally-on switch NON1 settles at a relatively small positive voltage.

Figure 7:
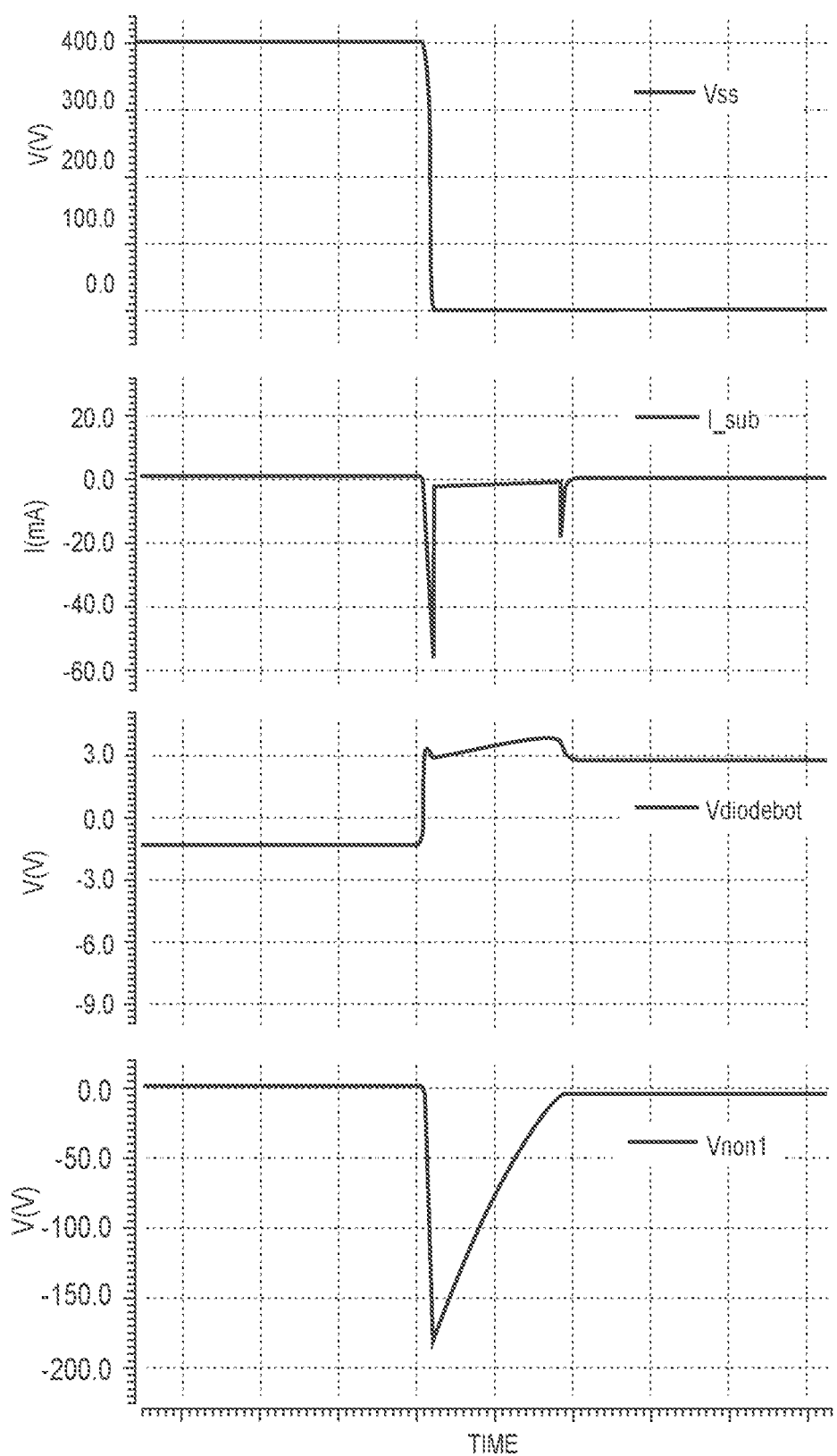

FIG. 7 shows the off-to-on transition during hard switching of the main bidirectional switch 100, with the second input-output terminal Vss2 being at a higher potential than the first input-output terminal Vss1.

Figure 8:
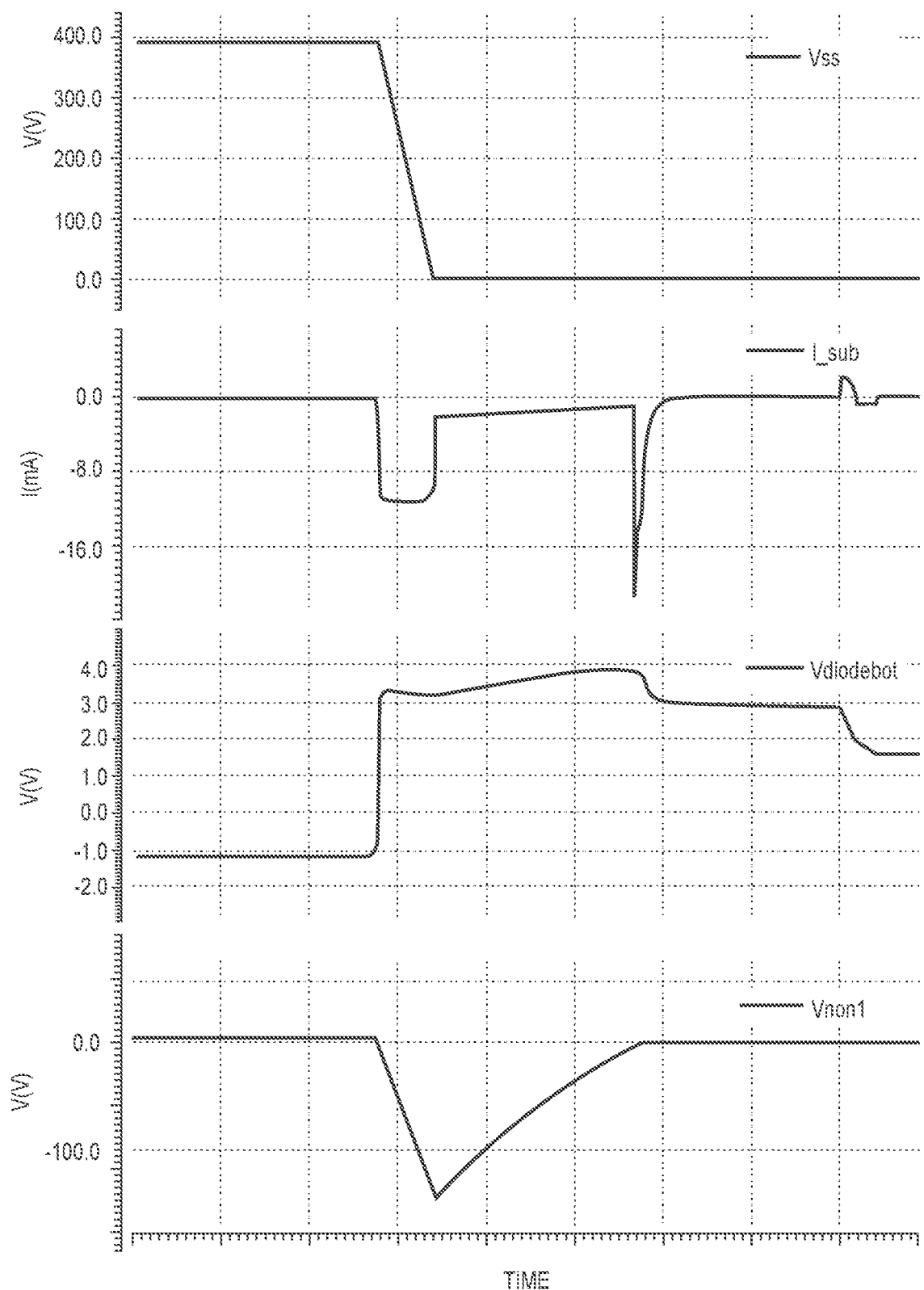

FIG. 8 shows the off-to-on transition during soft switching of the main bidirectional switch 100, with the second input-output terminal Vss2 being at a higher potential than the first input-output terminal Vss1.

If the first input-output terminal Vss1 instead was at the higher potential in the off-state of the main bidirectional switch 100, the second passive voltage clamping device or circuit 134 would clamp the voltage Vnon2 across the second normally-on switch NON2 to a negative voltage when the bidirectional switch 100 transitions to the on state and the first passive voltage clamping device or circuit 132 would provide a discharge path for the voltage Vnon1 across the first normally-on switch NON1 into Vnon2 until the first normally-on switch NON1 turns back on.

Although the present disclosure is not so limited, the following numbered examples demonstrate one or more aspects of the disclosure.

Example 1. A semiconductor device, comprising: a semiconductor body comprising an active region and a substrate region that is disposed beneath the active region; a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; and a passive substrate voltage discharge circuit in parallel with the bidirectional switch and configured to discharge a voltage of the substrate region in both directions of the bidirectional switch, the passive substrate voltage discharge circuit comprising first and second normally-on switches connected in anti-series between the first and second input-output terminals in a common source configuration with the substrate region as a midpoint.

Example 2. The semiconductor device of example 1, wherein the first normally-on switch has a drain terminal electrically connected to the first input-output terminal of the bidirectional switch, a source terminal electrically connected to the substrate region, and a gate terminal electrically connected to the substrate region, and wherein the second normally-on switch has a drain terminal electrically connected to the second input-output terminal of the bidirectional switch, a source terminal electrically connected to the substrate region, and a gate terminal electrically connected to the substrate region.

Example 3. The semiconductor device of example 2, wherein the passive substrate voltage discharge circuit comprises: a first voltage clamp circuit that electrically connects the source terminal of the first normally-on switch to the substrate region; and a second voltage clamp circuit that electrically connects the source terminal of the second normally-on switch to the substrate region.

Example 4. The semiconductor device of example 3, wherein the first voltage clamp circuit comprises a first Zener diode having a cathode electrically connected to the source terminal of the first normally-on switch and an anode electrically connected to the substrate region, and wherein the second voltage clamp circuit comprises a second Zener diode having a cathode electrically connected to the source terminal of the second normally-on switch and an anode electrically connected to the substrate region.

Example 5. The semiconductor device of example 4, wherein the first voltage clamp circuit comprises a first capacitor electrically connected in parallel with the first Zener diode, and wherein the second voltage clamp circuit comprises a second capacitor electrically connected in parallel with the second Zener diode.

Example 6. The semiconductor device of example 3, wherein the first voltage clamp circuit comprises a first normally-off switch having a source terminal electrically connected to the source terminal of the first normally-on switch, a drain terminal electrically connected to the substrate region, and a gate electrically connected to the substrate region by a first resistor, and wherein the second voltage clamp circuit comprises a second normally-off switch having a source terminal electrically connected to the source terminal of the second normally-on switch, a drain terminal electrically connected to the substrate region, and a gate electrically connected to the substrate region by a second resistor.

Example 7. The semiconductor device of example 6, wherein the first voltage clamp circuit comprises at least one series connected diode electrically connected between the source terminal of the first normally-on switch and the gate of the first normally-off switch, and wherein the second voltage clamp circuit comprises at least one series connected diode electrically connected between the source terminal of the second normally-on switch and the gate of the second normally-off switch.

Example 8. The semiconductor device of example 7, wherein the first voltage clamp circuit further comprises a capacitor electrically connected in parallel with the at least one series connected diode of the first voltage clamp circuit, and wherein the second voltage clamp circuit further comprises a capacitor electrically connected in parallel with the at least one series connected diode of the second voltage clamp circuit.

Example 9. The semiconductor device of any of examples 3 through 8, wherein the semiconductor body comprises a type Ill semiconductor nitride, wherein the bidirectional switch is a high electron mobility transistor, and wherein the electrically conductive channel is a two-dimensional charge carrier gas.

Example 10. The semiconductor device of any of examples 1 through 9, wherein the first and second normally-on switches are normally-on high-electron-mobility transistors that are integrally formed in the semiconductor body.

Example 11. The semiconductor device of example 10, wherein a clamping voltage of the first voltage clamp circuit is higher in absolute magnitude than a turn-off threshold voltage of the first normally-on switch, and wherein a clamping voltage of the second voltage clamp circuit is higher in absolute magnitude than a turn-off threshold voltage of the second normally-on switch.

Example 12. The semiconductor device of any of examples 1 through 11, wherein in an off state of the bidirectional switch, the passive substrate voltage discharge circuit is configured to: maintain the first normally-on switch in an on state such that a voltage across the first normally-on switch is clamped to a forward threshold voltage above the voltage at the first input-output terminal; and build up a voltage between the substrate region and a source terminal of the second normally-on switch such that the second normally-on switch turns off and a voltage across the second normally-on switch corresponds to the voltage across the first and second input-output terminals less the voltage across the first normally-on switch.

Example 13. The semiconductor device of example 12, wherein when the bidirectional switch transitions from the off state to an on state, the voltage across the first and second input-output terminals drops to a conduction voltage and the passive substrate voltage discharge circuit is configured to provide a discharge path for the voltage across the second normally-on switch until the second normally-on switch turns back on.

Example 14. The semiconductor device of example 13, wherein in the on state of the bidirectional switch, the passive substrate voltage discharge circuit is configured to bring a gate-to-source voltage of the first and second normally-on switches to below their respective gate threshold voltages.

Example 15. A semiconductor device, comprising: a semiconductor body comprising an active region and a substrate region that is disposed beneath the active region; a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; a first normally-on switch having a drain terminal electrically connected to the first input-output terminal of the bidirectional switch, a source terminal electrically connected to the substrate region by a first passive voltage clamping device or circuit, and a gate terminal electrically connected to the substrate region; and a second normally-on switch having a drain terminal electrically connected to the second input-output terminal of the bidirectional switch, a source terminal electrically connected to the substrate region by a second passive voltage clamping device or circuit, and a gate terminal electrically connected to the substrate region.

Example 16. The semiconductor device of example 15, wherein: the first passive voltage clamping device or circuit is configured to clamp a voltage across the first normally-on switch to a positive voltage when the bidirectional switch is in an off state and to a negative voltage when the bidirectional switch is in an on state; and the second passive voltage clamping device or circuit is configured to build up a voltage between the substrate region and the source terminal of the second normally-on switch when the bidirectional switch is in the off state such that the second normally-on switch turns off when the bidirectional switch is in the off state, and to provide a discharge path for the voltage across the second normally-on switch until the second normally-on switch turns back on.

Example 17. The semiconductor device of example 15 or 16, wherein the first voltage clamp circuit comprises a first Zener diode having a cathode electrically connected to the source terminal of the first normally-on switch and an anode electrically connected to the substrate region, and wherein the second voltage clamp circuit comprises a second Zener diode having a cathode electrically connected to the source terminal of the second normally-on switch and an anode electrically connected to the substrate region.

Example 18. The semiconductor device of example 17, wherein the first voltage clamp circuit comprises a first capacitor electrically connected in parallel with the first Zener diode, and wherein the second voltage clamp circuit comprises a second capacitor electrically connected in parallel with the second Zener diode.

Example 19. The semiconductor device of any of examples 15 through 18, wherein the first voltage clamp circuit comprises a first normally-off switch having a source terminal electrically connected to the source terminal of the first normally-on switch, a drain terminal electrically connected to the substrate region, and a gate electrically connected to the substrate region by a first resistor, and wherein the second voltage clamp circuit comprises a second normally-off switch having a source terminal electrically connected to the source terminal of the second normally-on switch, a drain terminal electrically connected to the substrate region, and a gate electrically connected to the substrate region by a second resistor.

Example 20. The semiconductor device of example 19, wherein the first voltage clamp circuit comprises at least one series connected diode electrically connected between the source terminal of the first normally-on switch and the gate of the first normally-off switch, and wherein the second voltage clamp circuit comprises at least one series connected diode electrically connected between the source terminal of the second normally-on switch and the gate of the second normally-off switch.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising an active region and a substrate region that is disposed beneath the active region;
a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; and
a passive substrate voltage discharge circuit in parallel with the bidirectional switch and configured to discharge a voltage of the substrate region in both directions of the bidirectional switch, the passive substrate voltage discharge circuit comprising first and second normally-on switches connected in anti-series between the first and second input-output terminals in a common source configuration with the substrate region as a midpoint,
wherein the first normally-on switch has a drain terminal electrically connected to the first input-output terminal of the bidirectional switch, a source terminal electrically connected to the substrate region, and a gate terminal electrically connected to the substrate region,
wherein the second normally-on switch has a drain terminal electrically connected to the second input-output terminal of the bidirectional switch, a source terminal electrically connected to the substrate region, and a gate terminal electrically connected to the substrate region,
wherein the passive substrate voltage discharge circuit comprises:
a first voltage clamp circuit that electrically connects the source terminal of the first normally-on switch to the substrate region; and
a second voltage clamp circuit that electrically connects the source terminal of the second normally-on switch to the substrate region.

2. The semiconductor device of claim 1, wherein the first voltage clamp circuit comprises a first Zener diode having a cathode electrically connected to the source terminal of the first normally-on switch and an anode electrically connected to the substrate region, and wherein the second voltage clamp circuit comprises a second Zener diode having a cathode electrically connected to the source terminal of the second normally-on switch and an anode electrically connected to the substrate region.

3. The semiconductor device of claim 2, wherein the first voltage clamp circuit comprises a first capacitor electrically connected in parallel with the first Zener diode, and wherein the second voltage clamp circuit comprises a second capacitor electrically connected in parallel with the second Zener diode.

4. The semiconductor device of claim 1, wherein the first voltage clamp circuit comprises a first normally-off switch having a source terminal electrically connected to the source terminal of the first normally-on switch, a drain terminal electrically connected to the substrate region, and a gate electrically connected to the substrate region by a first resistor, and wherein the second voltage clamp circuit comprises a second normally-off switch having a source terminal electrically connected to the source terminal of the second normally-on switch, a drain terminal electrically connected to the substrate region, and a gate electrically connected to the substrate region by a second resistor.

5. The semiconductor device of claim 4, wherein the first voltage clamp circuit comprises at least one series connected diode electrically connected between the source terminal of the first normally-on switch and the gate of the first normally-off switch, and wherein the second voltage clamp circuit comprises at least one series connected diode electrically connected between the source terminal of the second normally-on switch and the gate of the second normally-off switch.

6. The semiconductor device of claim 5, wherein the first voltage clamp circuit further comprises a capacitor electrically connected in parallel with the at least one series connected diode of the first voltage clamp circuit, and wherein the second voltage clamp circuit further comprises a capacitor electrically connected in parallel with the at least one series connected diode of the second voltage clamp circuit.

7. The semiconductor device of claim 1, wherein the semiconductor body comprises a type III semiconductor nitride, wherein the bidirectional switch is a high electron mobility transistor, and wherein the electrically conductive channel is a two-dimensional charge carrier gas.

8. The semiconductor device of claim 1, wherein the first and second normally-on switches are normally-on high-electron-mobility transistors that are integrally formed in the semiconductor body.

9. The semiconductor device of claim 8, wherein a clamping voltage of the first voltage clamp circuit is higher in absolute magnitude than a turn-off threshold voltage of the first normally-on switch, and wherein a clamping voltage of the second voltage clamp circuit is higher in absolute magnitude than a turn-off threshold voltage of the second normally-on switch.

10. The semiconductor device of claim 1, wherein in an off state of the bidirectional switch, the passive substrate voltage discharge circuit is configured to:
maintain the first normally-on switch in an on state such that a voltage across the first normally-on switch is clamped to a forward threshold voltage above the voltage at the first input-output terminal; and
build up a voltage between the substrate region and a source terminal of the second normally-on switch such that the second normally-on switch turns off and a voltage across the second normally-on switch corresponds to the voltage across the first and second input-output terminals less the voltage across the first normally-on switch.

11. The semiconductor device of claim 10, wherein when the bidirectional switch transitions from the off state to an on state, the voltage across the first and second input-output terminals drops to a conduction voltage and the passive substrate voltage discharge circuit is configured to provide a discharge path for the voltage across the second normally-on switch until the second normally-on switch turns back on.

12. The semiconductor device of claim 11, wherein in the on state of the bidirectional switch, the passive substrate voltage discharge circuit is configured to bring a gate-to-source voltage of the first and second normally-on switches to below their respective gate threshold voltages.

13. A semiconductor device, comprising:
a semiconductor body comprising an active region and a substrate region that is disposed beneath the active region;
a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel;
a first normally-on switch having a drain terminal electrically connected to the first input-output terminal of the bidirectional switch, a source terminal electrically connected to the substrate region by a first passive voltage clamping device or circuit, and a gate terminal electrically connected to the substrate region; and
a second normally-on switch having a drain terminal electrically connected to the second input-output terminal of the bidirectional switch, a source terminal electrically connected to the substrate region by a second passive voltage clamping device or circuit, and a gate terminal electrically connected to the substrate region.

14. The semiconductor device of claim 13, wherein:
the first passive voltage clamping device or circuit is configured to clamp a voltage across the first normally-on switch to a positive voltage when the bidirectional switch is in an off state and to a negative voltage when the bidirectional switch is in an on state; and
the second passive voltage clamping device or circuit is configured to build up a voltage between the substrate region and the source terminal of the second normally-on switch when the bidirectional switch is in the off state such that the second normally-on switch turns off when the bidirectional switch is in the off state, and to provide a discharge path for the voltage across the second normally-on switch until the second normally-on switch turns back on.

15. The semiconductor device of claim 13, wherein the first voltage clamp circuit comprises a first Zener diode having a cathode electrically connected to the source terminal of the first normally-on switch and an anode electrically connected to the substrate region, and wherein the second voltage clamp circuit comprises a second Zener diode having a cathode electrically connected to the source terminal of the second normally-on switch and an anode electrically connected to the substrate region.

16. The semiconductor device of claim 15, wherein the first voltage clamp circuit comprises a first capacitor electrically connected in parallel with the first Zener diode, and wherein the second voltage clamp circuit comprises a second capacitor electrically connected in parallel with the second Zener diode.

17. The semiconductor device of claim 13, wherein the first voltage clamp circuit comprises a first normally-off switch having a source terminal electrically connected to the source terminal of the first normally-on switch, a drain terminal electrically connected to the substrate region, and a gate electrically connected to the substrate region by a first resistor, and wherein the second voltage clamp circuit comprises a second normally-off switch having a source terminal electrically connected to the source terminal of the second normally-on switch, a drain terminal electrically connected to the substrate region, and a gate electrically connected to the substrate region by a second resistor.

18. The semiconductor device of claim 17, wherein the first voltage clamp circuit comprises at least one series connected diode electrically connected between the source terminal of the first normally-on switch and the gate of the first normally-off switch, and wherein the second voltage clamp circuit comprises at least one series connected diode electrically connected between the source terminal of the second normally-on switch and the gate of the second normally-off switch.

19. A semiconductor device, comprising:
a semiconductor body comprising an active region and a substrate region that is disposed beneath the active region;
a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; and
a passive substrate voltage discharge circuit in parallel with the bidirectional switch and configured to discharge a voltage of the substrate region in both directions of the bidirectional switch, the passive substrate voltage discharge circuit comprising first and second normally-on switches connected in anti-series between the first and second input-output terminals in a common source configuration with the substrate region as a midpoint,
wherein in an off state of the bidirectional switch, the passive substrate voltage discharge circuit is configured to:
maintain the first normally-on switch in an on state such that a voltage across the first normally-on switch is clamped to a forward threshold voltage above the voltage at the first input-output terminal; and build up a voltage between the substrate region and a source terminal of the second normally-on switch such that the second normally-on switch turns off and a voltage across the second normally-on switch corresponds to the voltage across the first and second input-output terminals less the voltage across the first normally-on switch.

20. The semiconductor device of claim 19, wherein when the bidirectional switch transitions from the off state to an on state, the voltage across the first and second input-output terminals drops to a conduction voltage and the passive substrate voltage discharge circuit is configured to provide a discharge path for the voltage across the second normally-on switch until the second normally-on switch turns back on.

21. The semiconductor device of claim 20, wherein in the on state of the bidirectional switch, the passive substrate voltage discharge circuit is configured to bring a gate-to-source voltage of the first and second normally-on switches to below their respective gate threshold voltages.

22. A semiconductor device, comprising:
 a semiconductor body comprising an active region and a substrate region that is disposed beneath the active region;
 a bidirectional switch formed in the semiconductor body and comprising first and second gate structures that are each configured to control a conductive state of an electrically conductive channel that is disposed in the active region, and first and second input-output terminals that are each in ohmic contact with the electrically conductive channel; and
 a passive substrate voltage discharge circuit in parallel with the bidirectional switch and configured to discharge a voltage of the substrate region in both directions of the bidirectional switch, the passive substrate voltage discharge circuit comprising first and second normally-on switches connected in anti-series between the first and second input-output terminals in a common source configuration with the substrate region as a midpoint,
 wherein the first and second normally-on switches are normally-on high-electron-mobility transistors that are integrally formed in the semiconductor body,
 wherein a clamping voltage of the first voltage clamp circuit is higher in absolute magnitude than a turn-off threshold voltage of the first normally-on switch,
 wherein a clamping voltage of the second voltage clamp circuit is higher in absolute magnitude than a turn-off threshold voltage of the second normally-on switch.

* * * * *